(12) United States Patent
Henson et al.

(10) Patent No.: US 6,898,077 B2
(45) Date of Patent: May 24, 2005

(54) SECURE HOUSING

(75) Inventors: Walter Herbert Henson, Hornchurch (GB); Anthony Lawrence, Romford (GB)

(73) Assignee: Neopost Limited, Romford (GB)

( * ) Notice: Subject to any disclaimer, the term of this patent is extended or adjusted under 35 U.S.C. 154(b) by 0 days.

(21) Appl. No.: 10/377,112

(22) Filed: Mar. 3, 2003

(65) Prior Publication Data

US 2003/0156392 A1 Aug. 21, 2003

Related U.S. Application Data

(63) Continuation of application No. 09/493,191, filed on Jan. 28, 2000, now abandoned.

(30) Foreign Application Priority Data

Jan. 29, 1999 (GB) ................................................ 9902056

(51) Int. Cl.[7] .............................. H05K 7/20; H05K 5/00
(52) U.S. Cl. ........................ 361/685; 361/800; 361/797; 439/66
(58) Field of Search ................................. 361/685, 684, 361/683, 825, 752, 797, 816, 800; 439/66

(56) References Cited

U.S. PATENT DOCUMENTS

| 3,631,299 | A | | 12/1971 | Meyer |
| 4,421,977 | A | | 12/1983 | Kittredge |
| 4,591,657 | A | | 5/1986 | Masters |
| 4,987,639 | A | * | 1/1991 | Baiuley et al. ................ 16/445 |
| 5,107,404 | A | * | 4/1992 | Tam ............................ 361/818 |
| 5,111,362 | A | * | 5/1992 | Flamm et al. ............... 361/736 |
| 5,353,201 | A | | 10/1994 | Maeda |
| 6,339,535 | B1 | * | 1/2002 | Gahl ........................... 361/801 |
| 6,409,326 | B1 | * | 6/2002 | Giles et al. .................... 347/87 |

FOREIGN PATENT DOCUMENTS

| DE | 9201258.2 | 5/1992 |
| GB | 9902056.2 | 3/1999 |

* cited by examiner

*Primary Examiner*—David Martin
*Assistant Examiner*—Hung S. Bui
(74) *Attorney, Agent, or Firm*—Shoemaker and Mattare

(57) ABSTRACT

A secure electronic circuit on a printed circuit board is disclosed. The electronic circuit is enclosed in a housing comprising two shells located in abutment with opposite faces of the printed circuit board. One shell is provided with a first element that extends through an aperture in the printed circuit board and the other shell is provided with a second element that irreversibly engages with the first element and thereby secures both shells to the circuit board and inhibits removal of either shell. The construction is such that removal of either shell results in irreversible damage to the housing.

6 Claims, 1 Drawing Sheet

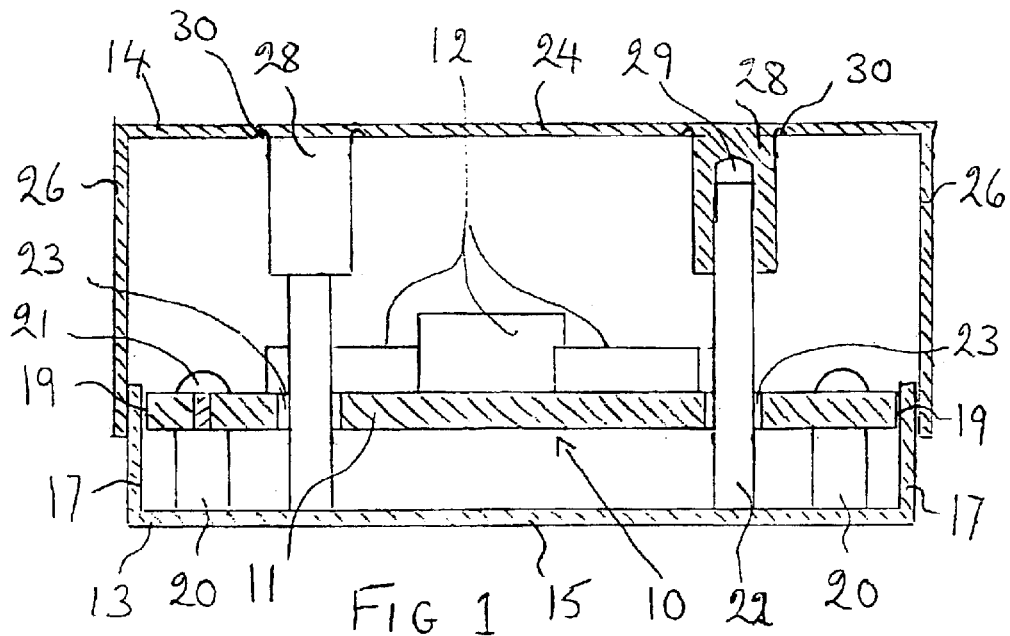
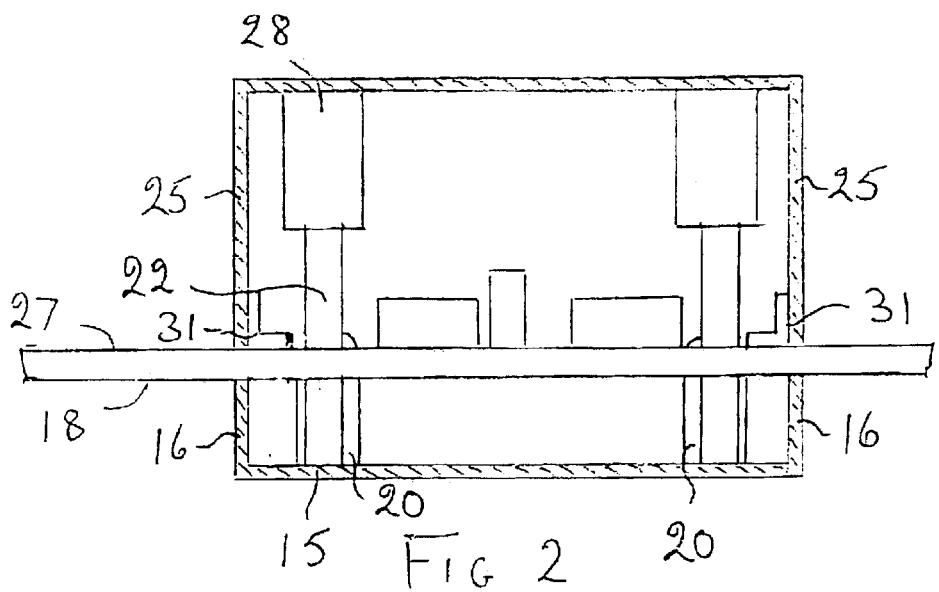

SECURE HOUSING

This application is a continuation of U.S. application Ser. No. 09/493,191 filed Jan. 28, 2000, now abandoned.

BACKGROUND OF THE INVENTION

This invention relates to a construction of secure housing and in particular to a construction of secure housing for preventing access to circuits on a printed circuit board.

It is known in the construction of postage meters to enclose electronic circuits and mechanical components that are critical to the proper functioning of the postage meter in a secure housing to prevent unauthorised access to said circuits and mechanical components. The housing may comprise two parts assembled together and then a seal is applied so that unauthorised entry to the housing results in breaking of the seal thereby providing evidence that unauthorised entry to the housing has been attempted or has occurred.

SUMMARY OF THE INVENTION

According to the present invention, a secure electronic circuit on a printed circuit board includes a secure housing, said secure housing including a first shell secured in abutting relationship with a first face of the printed circuit board; at least one first element projecting from said first shell and extending through an aperture in said printed circuit board beyond a second face of the printed circuit board opposite to said first face; a second shell located adjacent to said second face of the printed circuit board; at least one second element integral with said second shell and located within said second shell; said second shell being secured in abutting relationship with the second face of the printed circuit board by irreversible engagement of said at least one second element and said at least one first element so that removal of or attempt to remove the second shell from the printed circuit board results in fracture of at least one of said first and second elements to provide evidence of tampering.

BRIEF DESCRIPTION OF THE DRAWING

An embodiment of the invention will now be described by way of example by reference to the drawings in which:

FIG. 1 is transverse section through a secure housing preventing access to electronic circuits, and FIG. 2 is a longitudinal section through the secure housing.

DESCRIPTION OF THE PREFERRED EMBODIMENT

Referring to the drawings, a printed circuit board 10 comprises a substrate 11 carrying discrete electronic circuit components 12 that are interconnected by electrically conductive tracks (not shown) extending on one or both faces of the substrate 11. If the printed circuit board is a multi-layer device further electrically conductive tracks may extend in internal planes within the thickness of the substrate 11. In order to protect electronic circuits comprising the components 12 and conductive tracks from unauthorised access, a secure housing consisting of a first shell 13 and a second shell 14 is provided.

The first shell 13 comprises a first wall 15 from which pairs of side walls 16, 17 extend. Free edges of the side walls 16 abut against a first face 18 of the substrate 11. The side walls 17 extend further than the side walls 16 so as to extend beyond the first face 18 of the substrate 11 across edges 19 of the substrate 11. Studs 20 extend, in the same direction as the side walls from the first wall 15. The ends of the studs are substantially co-planar with free edges of the side walls 16 and hence the studs and the side walls 16 abut the first face of the substrate 11. The first shell is secured to the substrate 11 by means of screws 21 passing through apertures in the substrate 11 and threadedly engaging in the studs 20. It will be appreciated that with the first shell secured to the substrate 11, the side walls 16 abut against the first face and the side walls 17 extend across the edges of the substrate 11. Accordingly access to the first face of the substrate 11 and to any electrical tracks or connections thereon is prevented. If desired the studs may be slightly shorter than the side walls 16 so as to ensure that when the first shell is secured by the screws 21 to the substrate 11, the free edges of the side walls 16 are held tight against the first face of the substrate 11.

The first shell is provided also with first elements 22 in the form of pins that extend from the first wall 13 through apertures 23 in the substrate 11 and beyond the substrate 11.

The second shell 14 comprises a second wall 24 from which pairs of side walls 25, 26 extend. Free edges of the side walls 25 abut against a second face 27 of the substrate 11 and the side walls 26 extend to a greater extent than the side walls 25 so as to extend beyond the second face of the substrate 11 and overlap the side walls 17 of the first shell. The second shell is provided with second elements 28 in the form of studs extending from the second wall 24 toward the substrate 11. The second elements 28 are located in opposition to the first elements 22 and have a bore 29 to receive the first elements 22. The bores 29 and the first elements 22 may be slightly tapered to enable entry of the first elements into the bores 29. However an essential relationship of the first elements and the bores is that the second shell can be pressed onto the first elements to a sufficient extent as to bring free edges of the side walls 25 into tight abutment against the second face of the substrate and that when the second shell is located with the side walls 25 abutting the substrate the first elements are held in an interference fit in the bores. The interference fit of the first elements in the bores is sufficiently strong as to provide irreversible engagement between the first and second elements so that in any attempt to remove the second shell the first elements remain engaged in the bores and force applied to attempt to remove the second shell results in fracture of the first or second elements.

Preferably, the second shell includes weakened regions 30 in locations adjacent bases of the studs 28. The weakened regions may each comprise a groove in the second wall extending around the stud 28. Accordingly if a force is applied to attempt to remove the second shell, removal of the shell will be resisted by the engagement of the first elements in the bores of the second elements and the force will result in fracture of the second wall at one or more of the weakened regions 30. It will be appreciated that the fracture of the second wall provides evidence that tampering has occurred or has been attempted. It is to be understood that the weakened region may be located adjacent the second elements of the second shell as indicated in the drawings or adjacent the first elements of the first shell. Furthermore, locations of the first and second elements may be interchanged, second elements having a bore therein being formed as part of the first shell and the elements 22 being formed as part of the second shell.

While it is convenient to secure the first shell to the printed circuit board substrate by screws, if desired this securing may be omitted. The first shell may then be located relative to the printed circuit board by the first elements extending through apertures in the printed circuit board substrate and be secured to the substrate by the substrate being sandwiched between the first and second shells.

As described hereinbefore, the walls 17 and 26 of the first and second shells extend across the edges 19 of the printed circuit board. However if desired the side walls of one of the shells, for example side walls 17 may abut against the face of the circuit board and only the side walls of the other shell, for example side walls 26 extend across the edges of the printed circuit board so as to overlap the side walls 17.

Generally the first and second shells can be manufactured to be sufficiently rigid and to tolerances such that invasive tampering via access between the side walls 16 or 23 and the substrate to the electronic circuits is prevented. However in order to provide greater protection from such invasive tampering, elements 31 may be provided on one or both faces of the substrate and secured to the substrate. These elements 31 extend internally of the shell adjacent the side wall thereof. The elements 31 extend from the face of the substrate to an extent sufficient to prevent any implement inserted between the side wall 23 and the second face of the substrate from reaching the electronic circuits housing with the secure housing. The elements may be of any convenient form suitable to impede insertion of an implement and for example may be of 'L' section as shown in FIG. 2.

The first and second shells are each manufactured as integral mouldings so that the side walls and first and second elements are integral with the first and second walls respectively. The first and second shells may be formed of synthetic plastics material or of metal.

It will be appreciated that, as shown in FIG. 1, access at the edges 19 of the printed circuit board to the electronic circuits is prevented by the overlap of the side walls 17 and 26 of the first and second shells. Where the printed circuit board extends beyond the side walls 16, 25 of the first and second shells, access to the electronic circuits enclosed within the secure housing is prevented by close abutting engagement of the side walls with the surface of the printed circuit board and additionally is prevented by the elements 31.

What is claimed is:

1. A secure electronic device comprising a printed circuit board having first and second oppositely-directed faces and including an electronic circuit thereon, and a secure housing enclosing the electronic circuit, the secure housing including a first shell secured in abutting relationship with the first face of the printed circuit board, at least one first element projecting from the first shell and extending through an aperture in the printed circuit board beyond the second face of the printed circuit board, a second shell secured in abutting relationship with the second face of the printed circuit board, and at least one second element integral with the second shell and located within the second shell, the at least one second element engaging the at least one first element and being configured such that, in all circumstances, removal of or an attempt to remove the second shell from the printed circuit board causes fracture of at least one of the first and second elements to provide evidence of tampering.

2. A secure electronic device as claimed in claim 1 wherein one of the first and second elements includes a bore therein and the other of the first and second elements comprises a pin engageable in the bore of the one element in an irreversible interference fit.

3. A secure electronic device as claimed in claim 1 wherein the secure housing includes a weakened region adjacent at least one of the first and second elements and being effective to fracture when a force is applied to separate the first and second shells.

4. A secure electronic device as claimed in claim 1 wherein each said shell includes side walls having free edges in abutting engagement with a respective face of the printed circuit board.

5. A secure electronic device as claimed in claim 1 wherein the first and second shells each include a side wall, and at least one of the shells extends beyond an edge of the printed circuit board, whereby the side wall of the at least one shell extends adjacent the edge and overlaps the side wall of the other shell.

6. A secure electronic device as claimed in claim 1 wherein the printed circuit board includes a tamper-preventing element secured thereto adjacent an abutment with at least one of the first and second shells, the tamper-preventing element being effective to prevent tampering entry into the at least one shell.

* * * * *